(12) United States Patent
Kim

(10) Patent No.: US 7,368,333 B2
(45) Date of Patent: May 6, 2008

(54) SEMICONDUCTOR DEVICE AND METHOD OF MANUFACTURING THE SAME BY USING ATOMIC LAYER DEPOSITION

(75) Inventor: Jun-Seuck Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 58 days.

(21) Appl. No.: 11/438,315

(22) Filed: May 23, 2006

(65) Prior Publication Data

US 2006/0267081 A1    Nov. 30, 2006

(30) Foreign Application Priority Data

May 24, 2005   (KR) .................... 10-2005-0043476

(51) Int. Cl.
*H01L 21/00*   (2006.01)

(52) U.S. Cl. .................. 438/149; 438/151; 438/157; 257/E29.273

(58) Field of Classification Search ............... 438/149, 438/151, 157
See application file for complete search history.

(56) References Cited

U.S. PATENT DOCUMENTS

| | | | |
|---|---|---|---|
| 6,124,158 A | 9/2000 | Dautartas et al. | |
| 6,429,484 B1 | 8/2002 | Yu | |
| 6,723,589 B2 | 4/2004 | Lee et al. | |
| 6,828,218 B2 | 12/2004 | Kim et al. | |
| 2002/0079507 A1* | 6/2002 | Shim et al. ................. | 257/192 |
| 2004/0041212 A1 | 3/2004 | Bhattacharyya | |

FOREIGN PATENT DOCUMENTS

KR    10-0449782    9/2004

* cited by examiner

*Primary Examiner*—Thanh Nguyen
(74) *Attorney, Agent, or Firm*—Volentine & Whitt, PLLC

(57) ABSTRACT

A method of manufacturing a semiconductor device by using atomic layer deposition includes depositing a silicon atomic layer film on a semiconductor substrate. The method may also include forming an epitaxial silicon film on the silicon atomic layer film by using the silicon atomic layer film as a seed layer.

10 Claims, 12 Drawing Sheets

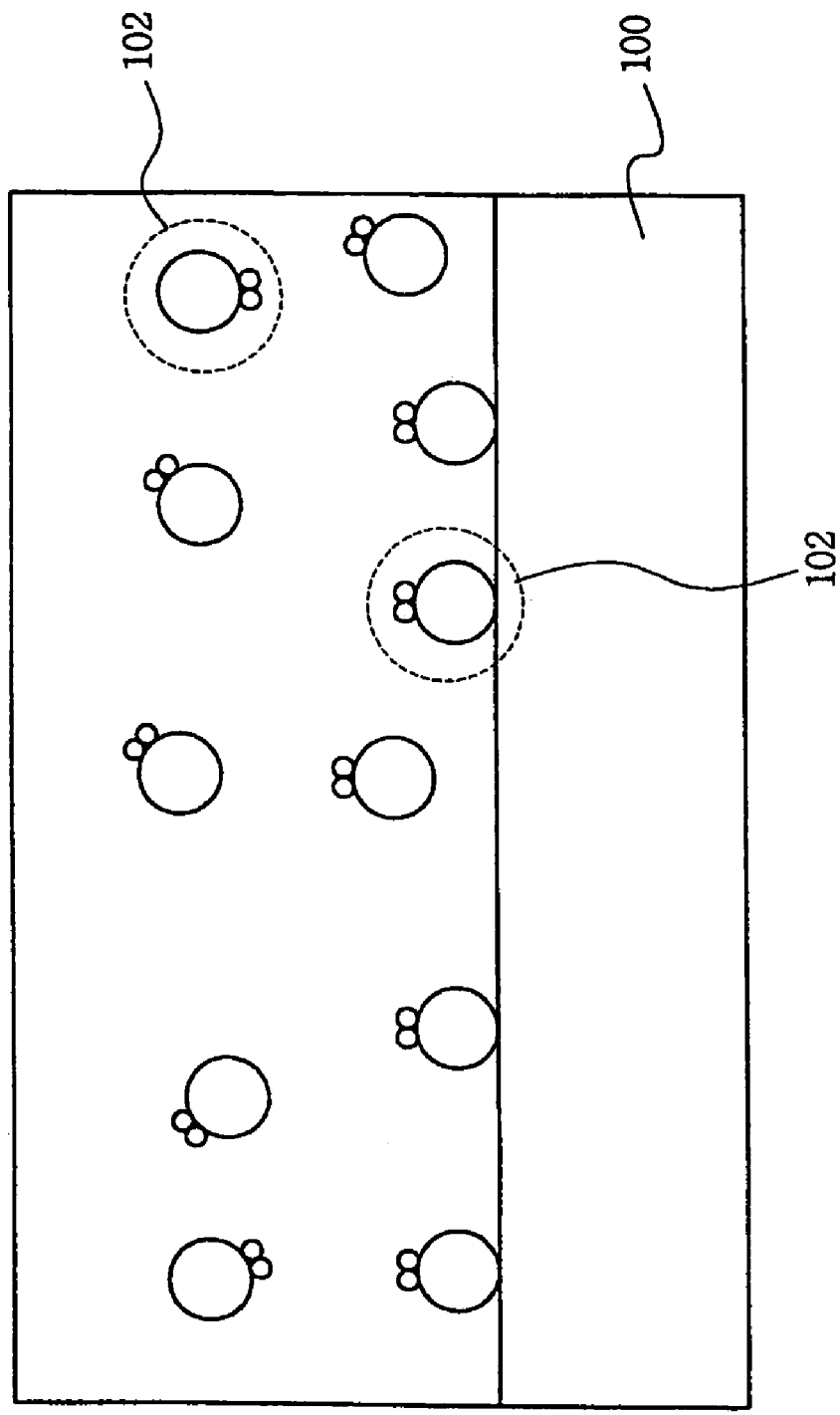

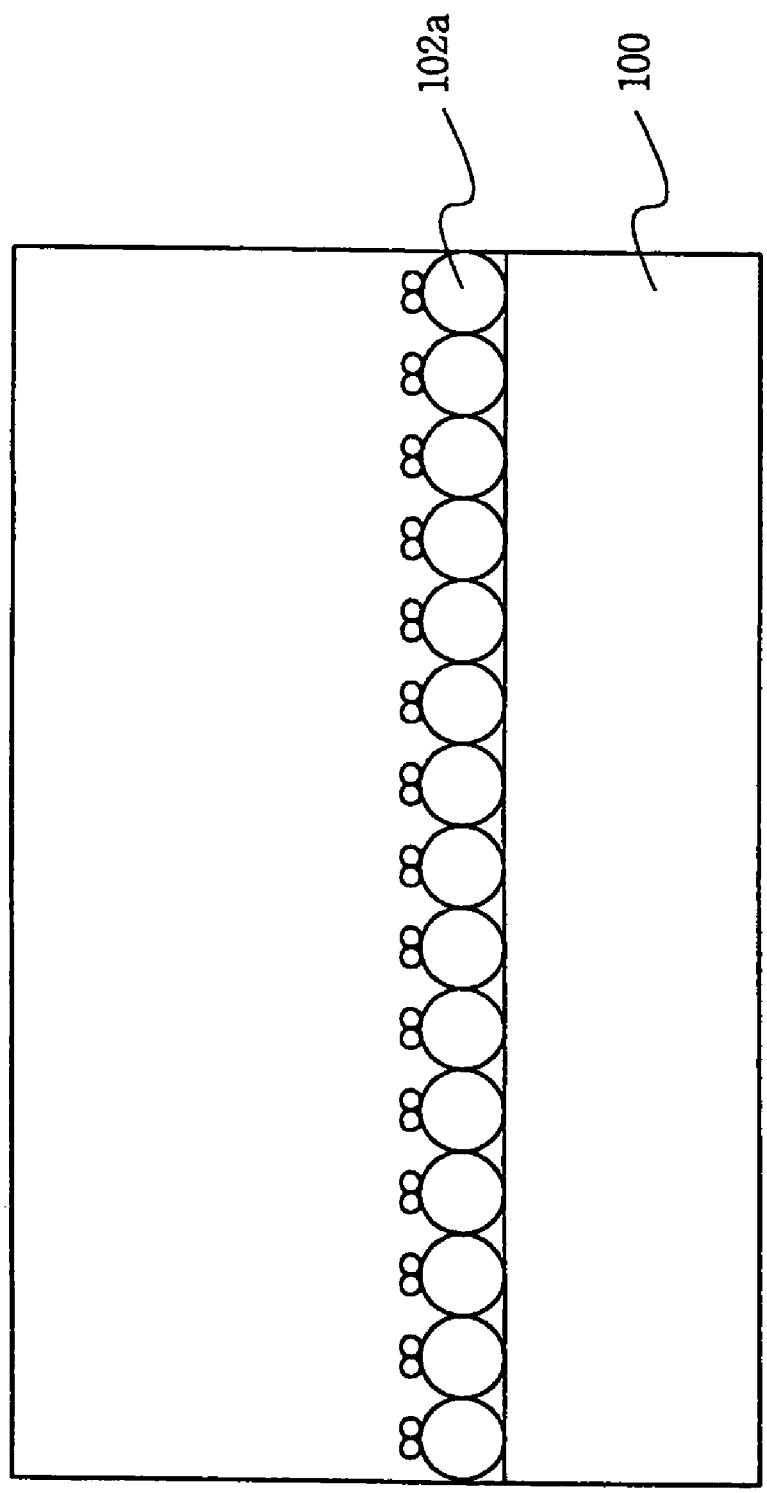

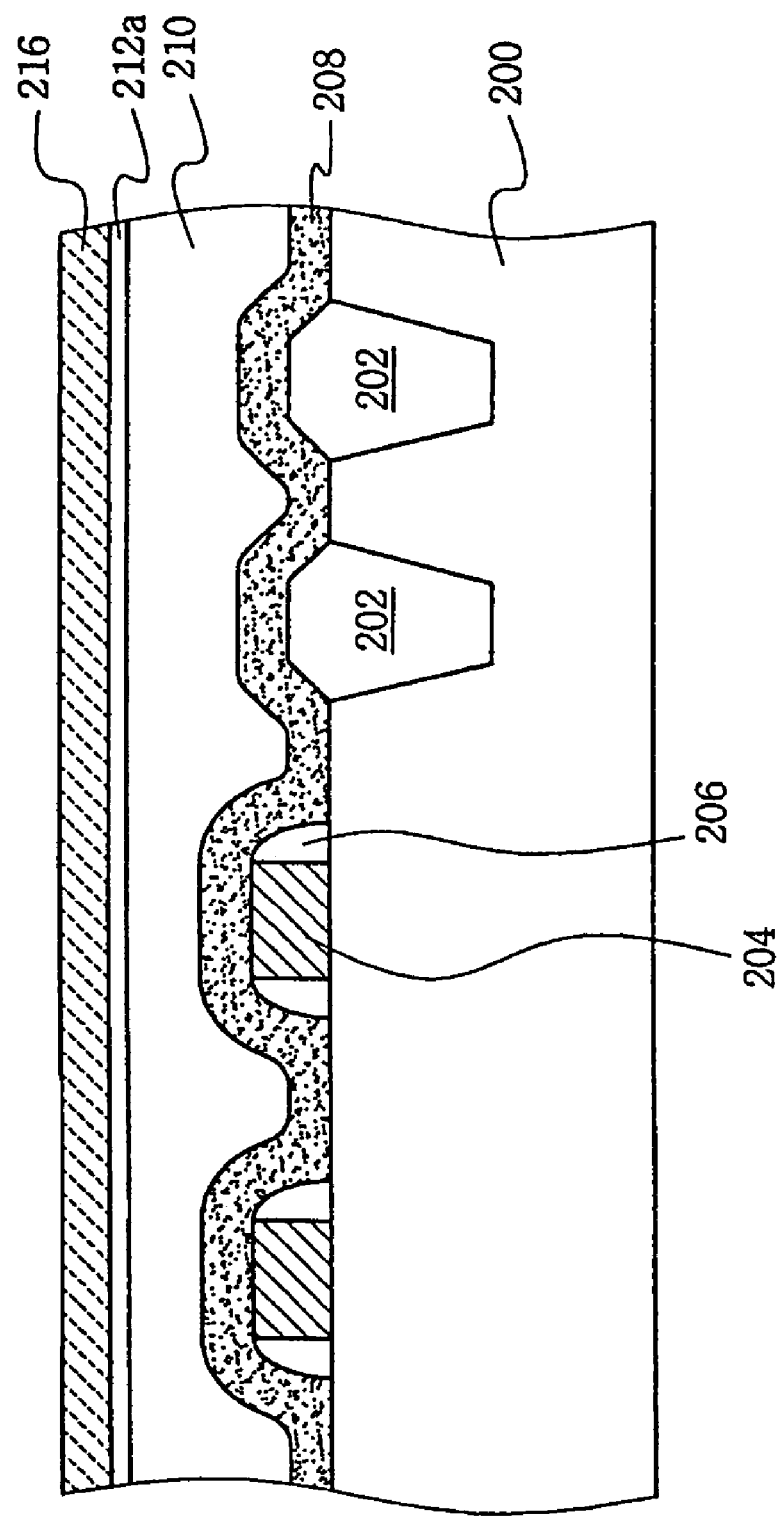

SEMICONDUCTOR DEVICE AND METHOD OF MANUFACTURING THE SAME BY USING ATOMIC LAYER DEPOSITION

BACKGROUND OF THE INVENTION

1. Field of the Invention

The present invention relates generally to a semiconductor device and a method of manufacturing the semiconductor device and, more particularly, to a semiconductor device and a method of manufacturing the same using atomic layer deposition.

A claim of priority is made to Korean Patent Application No. 10-2005-0043476 filed on May 24, 2005, the disclosure of which is incorporated hereby by reference in its entirety.

2. Description of the Related Art

Advancement in electronic devices such as, for example, computers, has lead to significant developments in the field of semiconductor components used in these devices. One major requirement of semiconductor components is the need to store large amounts of data in small storage areas. Furthermore, due to advancements in the field of computing technology, semiconductor components are required to have higher processing speeds than before.

Accordingly, as the size of semiconductor devices is continuously reduced and the processing speed of semiconductor devices is increased, there have been advances in the technology for forming a multi-layer semiconductor structure in a limited size. Some of the advances include changes in the semiconductor fabrication process, such as, for example, a "double layer" process for connecting a plurality of metal layers via contact, and a "deposited transistor process" for forming two or more transistors on the same vertical line of a semiconductor substrate in a vertical structure.

Furthermore, as part of the deposited transistor process, an epitaxial process may be used for forming a trench type of element separation film, a contact between a source and a drain region, and for forming an S-RAM. The word "Epitaxial" includes two words—"Epi" and "Taxial" which means "along the axis of a crystal". Accordingly, the epitaxial process includes growing a directional single crystal film on the upper surface of a semiconductor substrate. Generally, a single crystal silicone may be used to form a single crystal silicone film on the semiconductor substrate. Therefore, the epitaxial process may be used for forming a high-purity crystal layer on a semiconductor substrate. The epitaxial process may be widely used in the semiconductor device manufacturing because it may be used to grow the crystal layer at a lower temperature than that of a wafer.

The epitaxial process may be divided into three sub processes. These sub processes may include a Vapor Phase Epitaxy (VPE) process, a Liquid Phase Epitaxy (LPE) process, and a Molecular Beam Epitaxy (MBE) process. The VPE process may be used for growing a crystal using process gas. The LPE process may be used for growing the crystal by making a saturated solution in which a crystal material is melted, namely, a molten liquid, come in contact with the semiconductor substrate. The MBE process may be used for growing the crystal by enabling a crystal material vaporized in an ultra high vacuum reaction tube below 10~9 torr to reach the upper part of the semiconductor substrate while forming a molecular or atomic beam to react with the substrate surface.

A selective Epitaxial Growth (SEG) method is a process for growing a silicon film into a single crystal film, but only in a selected part of the semiconductor substrate. In order to obtain selective growth, the SEG process may include dividing a region to grow a silicon crystal prior to actually growing the crystal. The division may be achieved by dividing the region on the basis of whether the silicon crystal can or cannot be grown on a surface of that region. For example, the region for growing an epitaxial film exposes the semiconductor substrate formed with a silicone by removing a film such as silicon oxide through the photolithography and the etching process. The part in which the silicon substrate is selectively exposed so as to grow the epitaxial film through the etching process is referred to as a seed window.

FIGS. 1A to 1C illustrate a prior art method for manufacturing a semiconductor device in a single stack layer using the SEG process.

Referring to FIG. 1A, a gate region 14 provided with a sidewall space 16 may be formed on a P-type semiconductor substrate 10. An active region and a field region of the P-type semiconductor substrate 10 may be defined by a trench element separation film 12. Furthermore, though it may not be illustrated, an impurity diffusion area which functions as a source/drain region may be formed by performing an ion implantation of a pentavalent impurity in a lower part of the gate region 14.

In addition, an inter-layer insulation film may be formed by sequentially depositing an oxide film 20 such as a silicon nitride film (SiN) 18 and a HTO. The inter-layer insulation film may function as a buffer film at a thickness of, for example, 200 and 600 Å, on a front upper part of the semiconductor substrate 10 on which the gate region 14 is formed. In addition, a seed window 22 may be formed by exposing an impurity diffusion region (not shown) which functions as a source/drain region, by using a photolithography process. Furthermore, the same single crystal silicon film as the semiconductor substrate 10, i.e., a selective epitaxial film 24, is grown inside of the seed window 22 by performing the SEG process on the semiconductor substrate 10 that includes the seed window 22. At this time, the selective epitaxial film 24 may be grown in a temperature range of 700~750° C. and a pressure range of 5~200 Torr.

Referring to FIG. 1B, an amorphous silicon film may be deposited at a width of about 250 Å in front of the semiconductor substrate 10 on which the selective epitaxial film 24 is grown. Furthermore, a channel silicon pattern 26 may be formed by performing the photolithography process on the amorphous silicon film.

The channel silicon pattern 26 is a region on which a gate region of an upper transistor to be formed on the same vertical line of a lower transistor is formed. In addition, the gate region 14 is a gate region applied to the lower transistor in an aspect of the single stack layer structure.

Referring to FIG. 1C, an annealing process is performed on the semiconductor substrate 10 on which the channel silicon pattern 26 formed. As a result of the annealing process, the amorphous silicon film forming the channel silicon pattern 26 is converted into the same single crystal silicon film 26a as the selective epitaxial film 24. This forming of the channel silicon pattern 26 may be accomplished by enabling the selective epitaxial film 24 to be operated as a seed.

An upper transistor may be formed in a structure of a single stack layer. The upper transistor may be formed by forming a gate region 28 provided with a sidewall spacer 30 on the single crystal silicon film 26a and an impurity diffusion region (not shown). The impurity diffusion region may function as a source/drain region. At this time, the upper transistor is limited and formed to a channel silicon pattern formed with the single crystal silicon film 26a.

While the semiconductor device manufacturing method of FIGS. 1A to 1C may be used for manufacturing a semiconductor device in a structure of a single stack layer, the method has several shortcomings. For example, the method requires a large amount of time for growing the selective epitaxial film 24.

In addition, a growth speed at which the selective epitaxial film is converted may depend on the types of contacted material layers. For example, when a silicon epitaxial film is grown at an interface between a silicon film, a silicon nitride film, and an oxide film, the growth speed of the silicon epitaxial film is the highest at the interface which is in contact with the silicon film.

Referring to FIG. 1A, three types of material films may be exposed through the seed window 22 for exposing the semiconductor substrate 10. Specifically, a silicon film (A) forming the semiconductor substrate 10, a silicon nitride film (B) and an oxide film (C) for forming inter-layer insulation films are exposed. Accordingly, when the epitaxial process is performed on the seed window 22 on which the three material films are exposed, the silicon growth speed and crystal growth direction of the silicon epitaxial film which is grown at a region in contact with the silicon film (A) and the silicon growth speed and crystal growth direction of the silicon epitaxial film which is grown at a region in contact with the silicon nitride film (B) and the oxide film (C) are different from each other. Because of the difference between the silicon growth speed and crystal growth direction of the silicon epitaxial films, the selective epitaxial film 24 using a silicon film as a seed may be only grown inside of the seed window 22.

Accordingly, a growth rate of the epitaxial film may decrease leading to larger manufacturing times for semiconductor wafers. Furthermore, due to a reduction in the degree of integration, the manufacturing time loss may increase in a structure of a double stack layer in which three or more layers of transistors are deposited on the same vertical line as the semiconductor substrate.

In addition, the structure of the above-described single stack layer may form a channel silicon pattern so as to be arranged on the selective epitaxial layer 24. However, the seed window 22 for growing the selective epitaxial film 24 may be not formed in an accurate position. When the position of the seed window 22 is not accurate, a channel silicon pattern formed on an upper part of the seed window 22 may be not formed in an accurate position. Accordingly, as illustrated by reference numeral D in FIG. 1C, a node contact (not shown) may be shorted with the gate regions 14 and 16, thereby decreasing the reliability and yield of the semiconductor device.

The present disclosure is directed towards overcoming one or more of the problems associated with the prior art semiconductor manufacturing method.

SUMMARY OF THE INVENTION

One aspect of the present disclosure includes a method of manufacturing a semiconductor device by using atomic layer deposition. The method may comprise depositing a silicon atomic layer film on a semiconductor substrate. The method may also comprise forming an epitaxial silicon film on the silicon atomic layer film by using the silicon atomic layer film as a seed.

Another aspect of the present disclosure includes a method of manufacturing a semiconductor device using atomic layer deposition. The method may comprise forming a silicon atomic layer film on a semiconductor substrate. The method may also comprise performing a first annealing process which single-crystallizes the silicon atomic layer film. The method may also comprise forming an amorphous silicon film on the single-crystallized silicon atomic layer film. The method may also comprise performing a second annealing process on the semiconductor substrate having the amorphous silicon film to change the amorphous silicon film into a single-crystal epitaxial silicon film by using the single-crystallized silicon atomic layer film as a seed.

Yet another aspect of the present disclosure includes a method of manufacturing a semiconductor device by using atomic layer deposition. The method may comprise forming an interlayer insulation film on a semiconductor substrate including a first transistor. The method may also comprise depositing a silicon atomic layer film on the interlayer insulation film. The method may also comprise performing a first annealing process which single-crystallizes the silicon atomic layer film. The method may also comprise forming an amorphous silicon film on the single-crystallized silicon atomic layer film. The method may also comprise performing a second annealing process on the semiconductor substrate including the amorphous silicon film to change the amorphous silicon film into a single-crystal epitaxial silicon film by using the single-crystallized silicon atomic layer film as a seed. The method may also comprise forming a channel silicon pattern of a single stack layer by patterning the single-crystallized silicon atomic layer film and the epitaxial silicon film and forming a second transistor electrically connected to the channel silicon pattern.

Another aspect of the present disclosure includes a semiconductor device manufactured by using atomic layer deposition. The device may comprise a single-crystal silicon atomic layer film formed on a semiconductor substrate and an epitaxial silicon film formed on the single-crystal silicon atomic layer film, the epitaxial silicon film being single-crystallized from an initial amorphous silicon film by using the single-crystal silicon atomic layer film as a seed.

Another aspect of the present disclosure includes a semiconductor device manufactured by using atomic layer deposition. The semiconductor device may comprise an interlayer insulation layer formed on a semiconductor substrate including a first transistor. The device may also comprise a single-crystal silicon atomic layer film formed on the interlayer insulation layer. The device may also comprise an epitaxial silicon film formed on the single-crystal silicon atomic layer film, the epitaxial silicon film being single-crystallized from an initial amorphous silicon film by using the single-crystal silicon atomic layer film as a seed. The device may also comprise a channel silicon pattern of a single stack layer structure including the single-crystallized silicon atomic layer film and the epitaxial silicon film. The device may also comprise a second transistor electrically connected to the channel silicon pattern.

BRIEF DESCRIPTION OF THE DRAWINGS

The above aspects and other features of the present invention will become more apparent by describing in detail exemplary embodiments thereof with reference to the attached drawings in which:

FIGS. 2A to 2D illustrate schematically a deposition method of an atomic layer according to an exemplary disclosed embodiment; and FIGS. 3A to 3E illustrate a manufacturing process of a semiconductor device in a single stack layer structure in which a deposition method of an atomic layer is used according to an exemplary disclosed embodiment.

DETAILED DESCRIPTION OF EXEMPLARY EMBODIMENTS

Figure 1A:
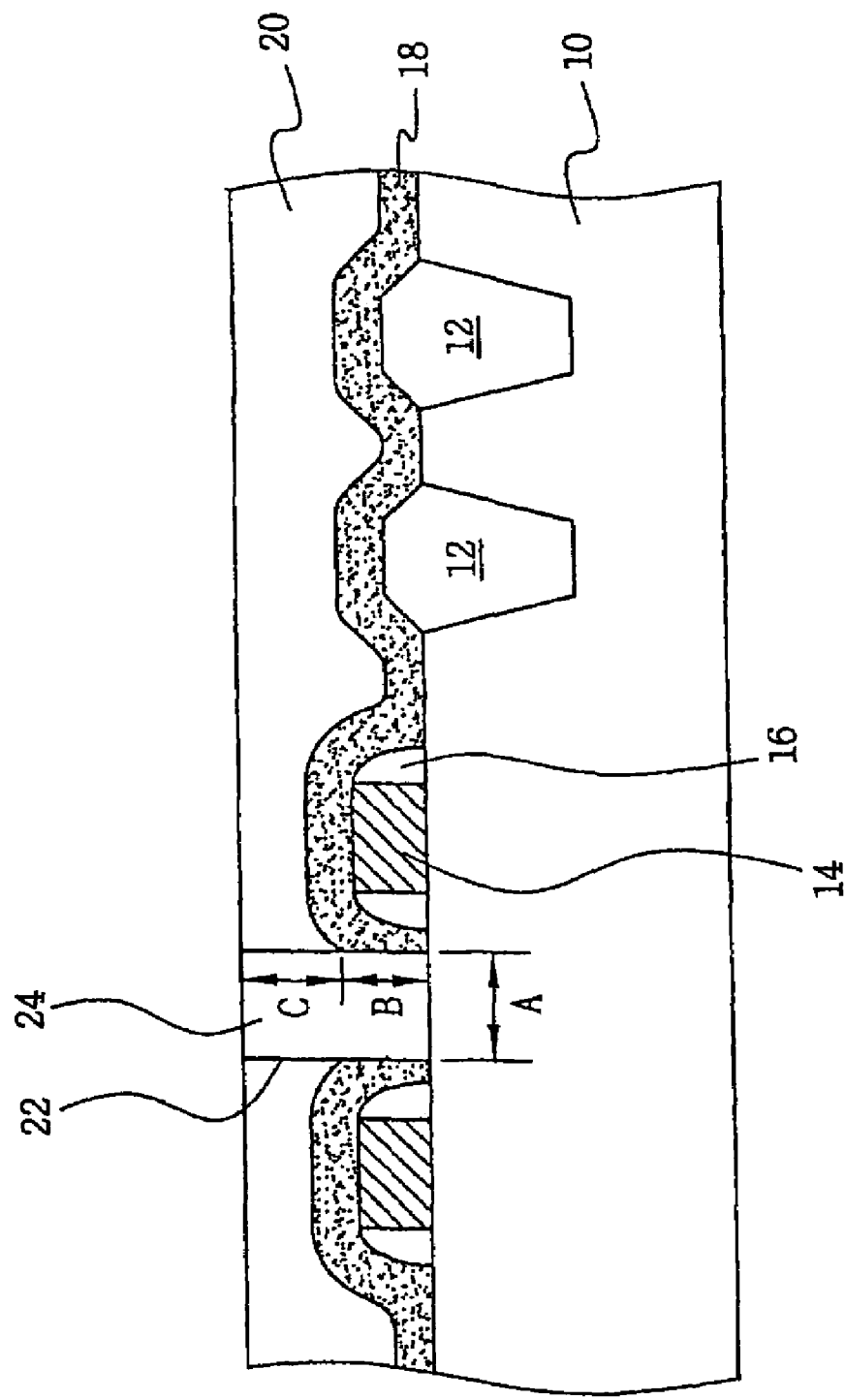
FIGS. 1A to 1C illustrate a cross-sectional structure of a prior art semiconductor device of a single stack layer in which a selective epitaxial growth method is used.
Figure 1B:
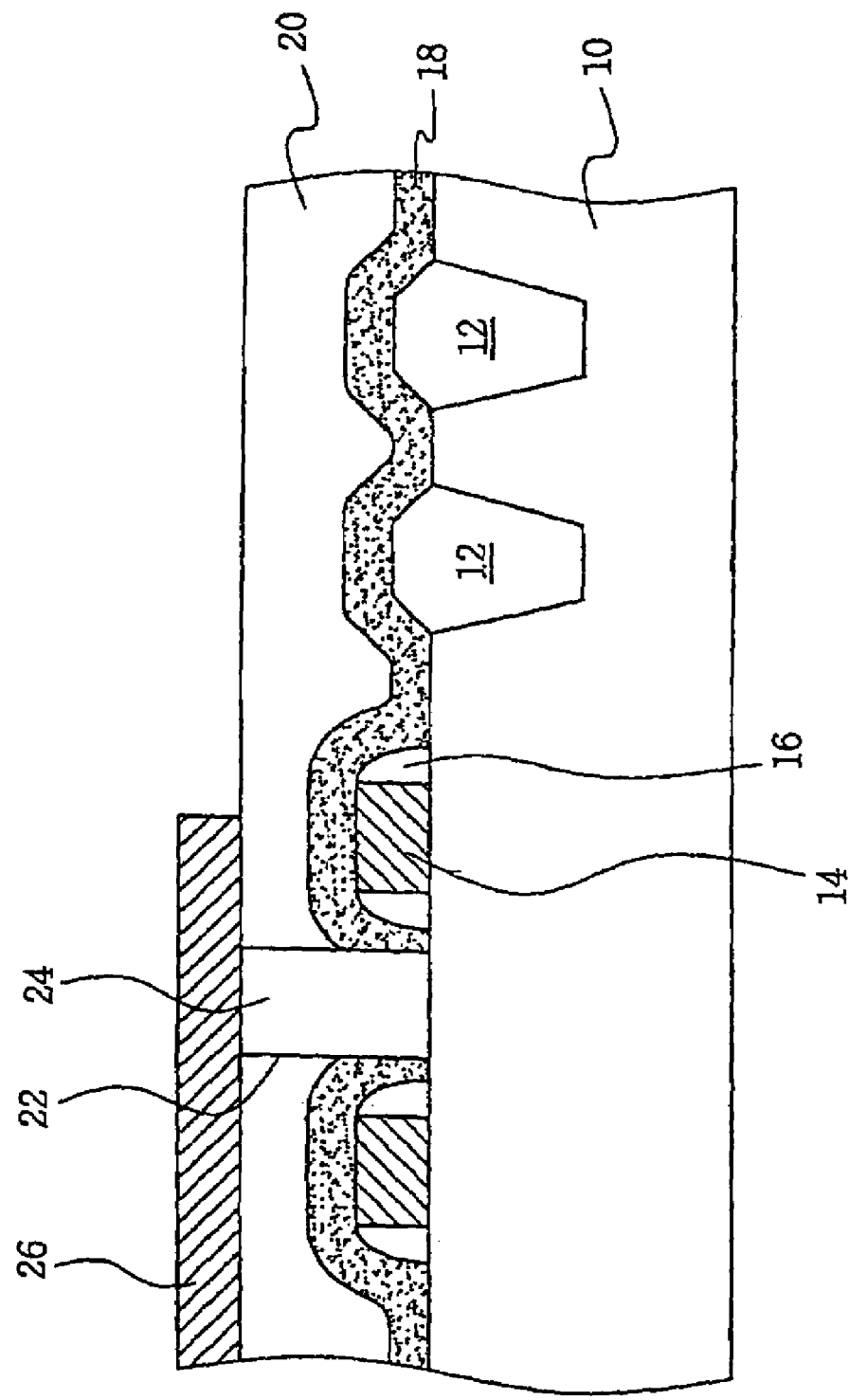
Figure 1C:
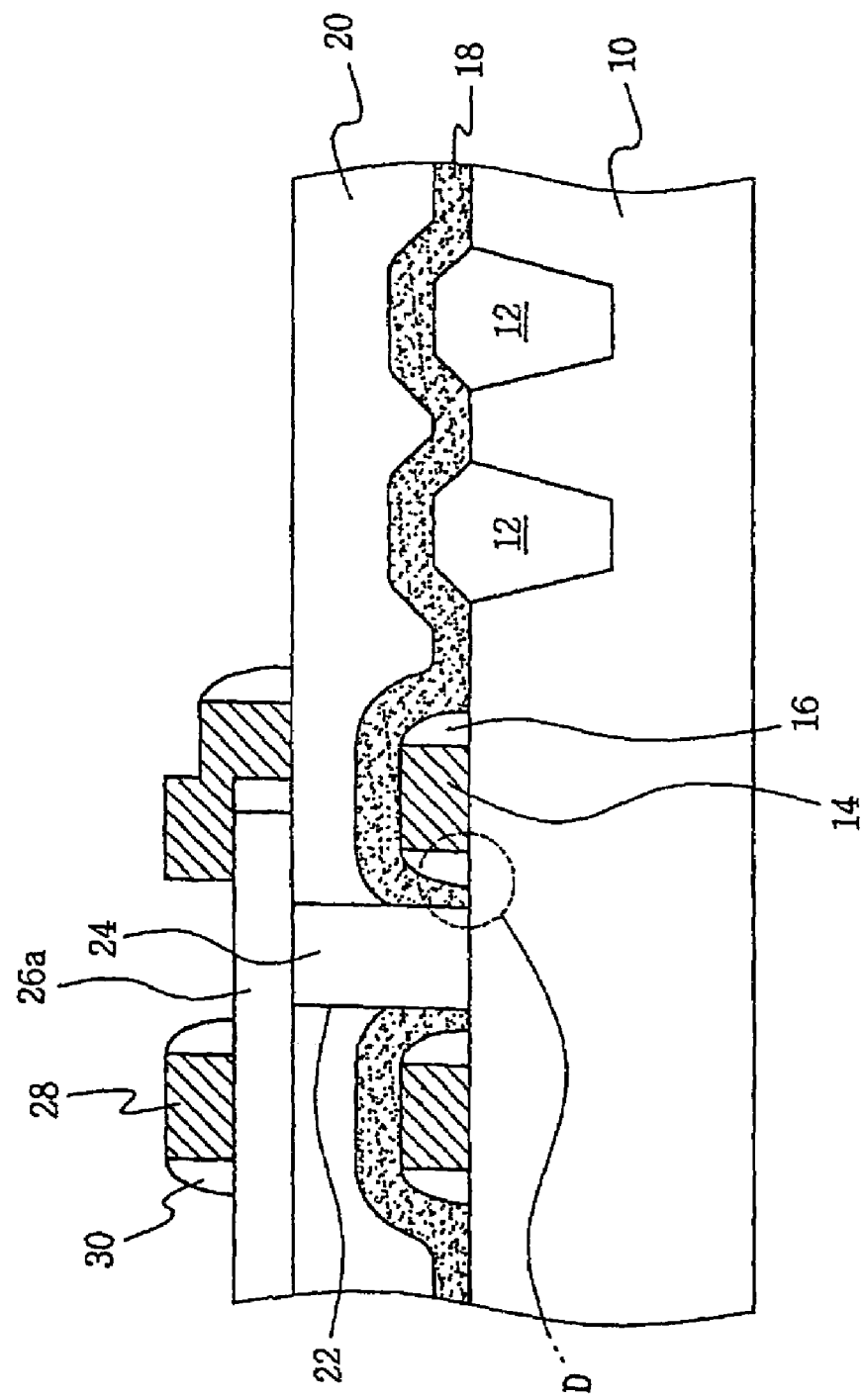

Subject matter and features of the exemplary embodiments of the present invention will be covered by the detailed description and drawings.

Exemplary embodiments of the invention are described in this section with reference to the corresponding drawings. These embodiments are presented as teaching examples. The actual scope of the invention is defined by the claims that follow.

Generally, a semiconductor device may be manufactured by depositing a thin film and by patterning the thin film into various circuit structures. A process for manufacturing the semiconductor device may include various unit processes such as, for example, an impurity ion-implantation process for implanting an impurity of Group 3B or Group 5B into the semiconductor substrate; a deposition process for forming a film which functions as an inter-layer insulation film or a conductive film on the semiconductor substrate; an etching process such as photolithography for forming a photosensitive film pattern on the deposited film and then patterning the film on the semiconductor substrate by using the photosensitive film pattern as an etching mask; a Chemical Mechanical Polishing (CMP) process for removing a step on a surface of the semiconductor substrate by polishing the surface; and a cleaning process for removing particles which are generated from the above processes including the Chemical Mechanical Polishing process.

In an exemplary embodiment of the present invention, while manufacturing a semiconductor device in a structure of a single stack layer, an epitaxial film is formed using an Atomic Layer Deposition (ALD) process instead of the SEG process which may have a low growth rate.

In general, an ALD technology is a technology for forming a thin film. Specifically, ALD may be used for growing a thin film of one monolayer per 1 cycle by sequentially dividing and providing two or more process gases that are necessary for obtaining a thin film at regular time intervals. The use of the plurality of gases separately from each other may prevent the gases from mixing with each other in gaseous form. Furthermore, the process of providing the gases periodically and repeatedly may make the ALD process different from a CVD or a PVD. In the ALD process, a deposition is made only by depositing material on a surface of a wafer. Because the deposition volume is limited on the wafer by the size of the wafer, a film having uniform thickness may be obtained on the whole of the wafer regardless of the volume of the process gases which are provided in gaseous form. Furthermore, because the thickness of the film which is deposited per provision cycle of the process gas is uniform, the thickness may be accurately controlled and estimated by controlling the number of provision cycles of the process gases. In addition, the step coverage may be good, a low temperature process may be practicable, and the thickness of the thin film may be accurately controlled by simply controlling a process variable (i.e., a cycle of providing a reactant). These features may make the ALD technology useful for manufacturing films with less thickness than those produced by the CVD or PVD processes.

In 1998, Samsung Electronics Co. firstly developed the ALD technology as a semiconductor device company and announced that an advanced D-RAM was developed by applying the ALD technology. The ALD process may make it easy to control a very thin film and may help coat nearly 100% of a complex structure because the thin film is formed by a chemical absorption instead of a chemical deposition. Furthermore, because the ALD technology can uniformly grow the film by a self-limited process, it may develop a film with a uniform thickness that cannot be obtained from conventional PVD and CVD technology. Therefore, the ALD technology may be a core semiconductor manufacturing technology that may be used to produce films such as, for example, a dielectric film for a memory, a diffusion preventing film, a gate dielectric film, or any other such film in which one must minutely control a deposition thickness of the thin film due to the small size of the semiconductor device. Embodiments of the manufacturing process of a semiconductor device using the ALD technology are disclosed in Korean Patent No. 0449782 and U.S. Pat. No. 6,124,158.

A thin film deposition principle according to the ALD technology will be explained with reference to FIGS. 2A to 2D.

Referring to FIG. 2A, a reactant $AX_n$ (not shown) which is a chemical bond of an element A and an element $X_n$ may be provided inside a chamber in which a semiconductor substrate 100 is loaded. As a result, as illustrated in FIG. 2B, a partial element A 102a of the reactant $AX_n$ 102 is adsorbed to the semiconductor substrate 100. At this time, since the absorption between the $AX_n$ materials has a weak bonding force that is created by physisorption, the $AX_n$ materials may be easily separated. On the contrary, the element A 102a adsorbed to the semiconductor substrate 100 may make bonds using the chemisorption process. The bonds produced by the chemisorption process may have a stronger bonding force than those created by physisorption.

Figure 2C:
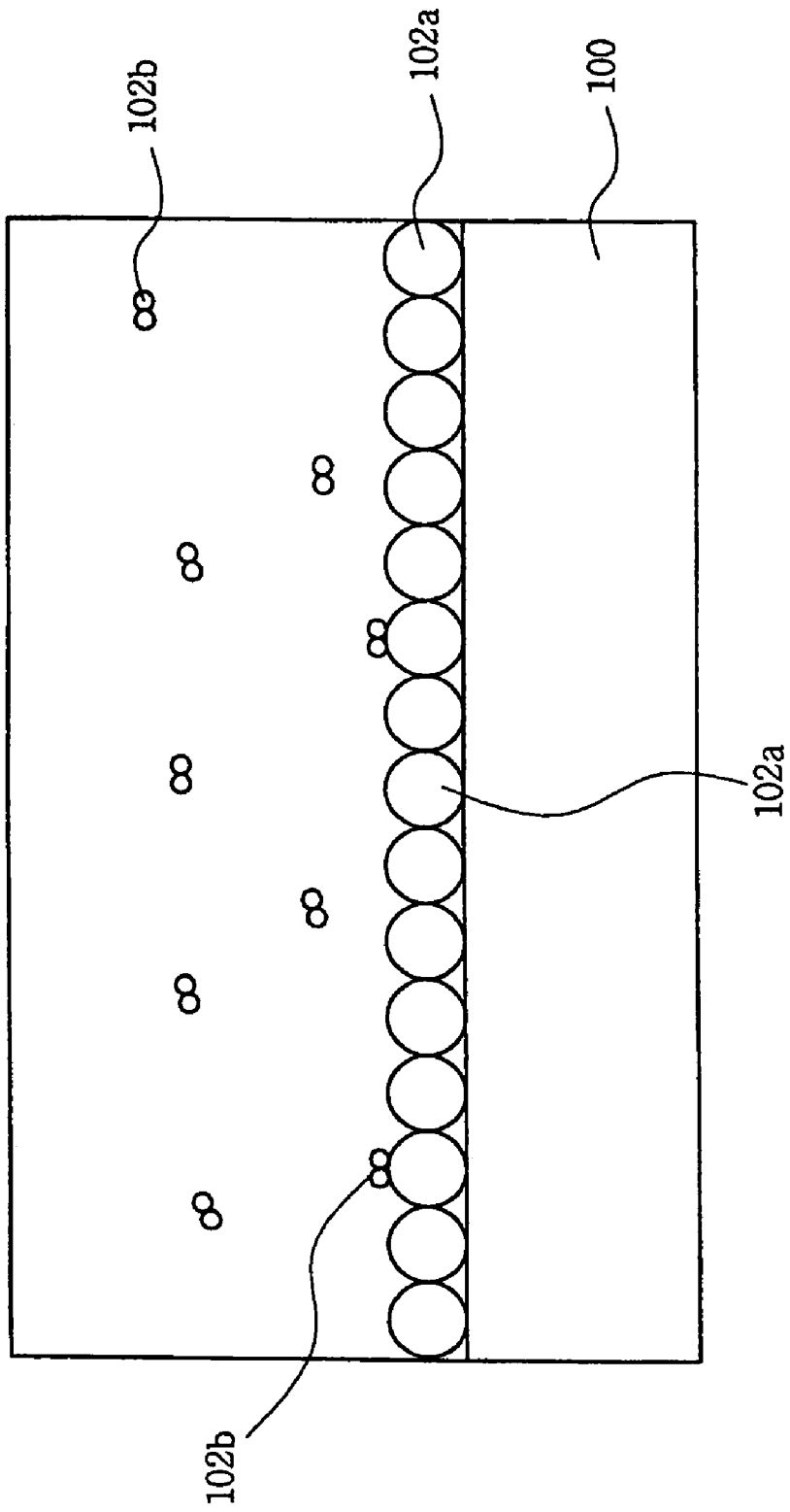
Figure 2D:
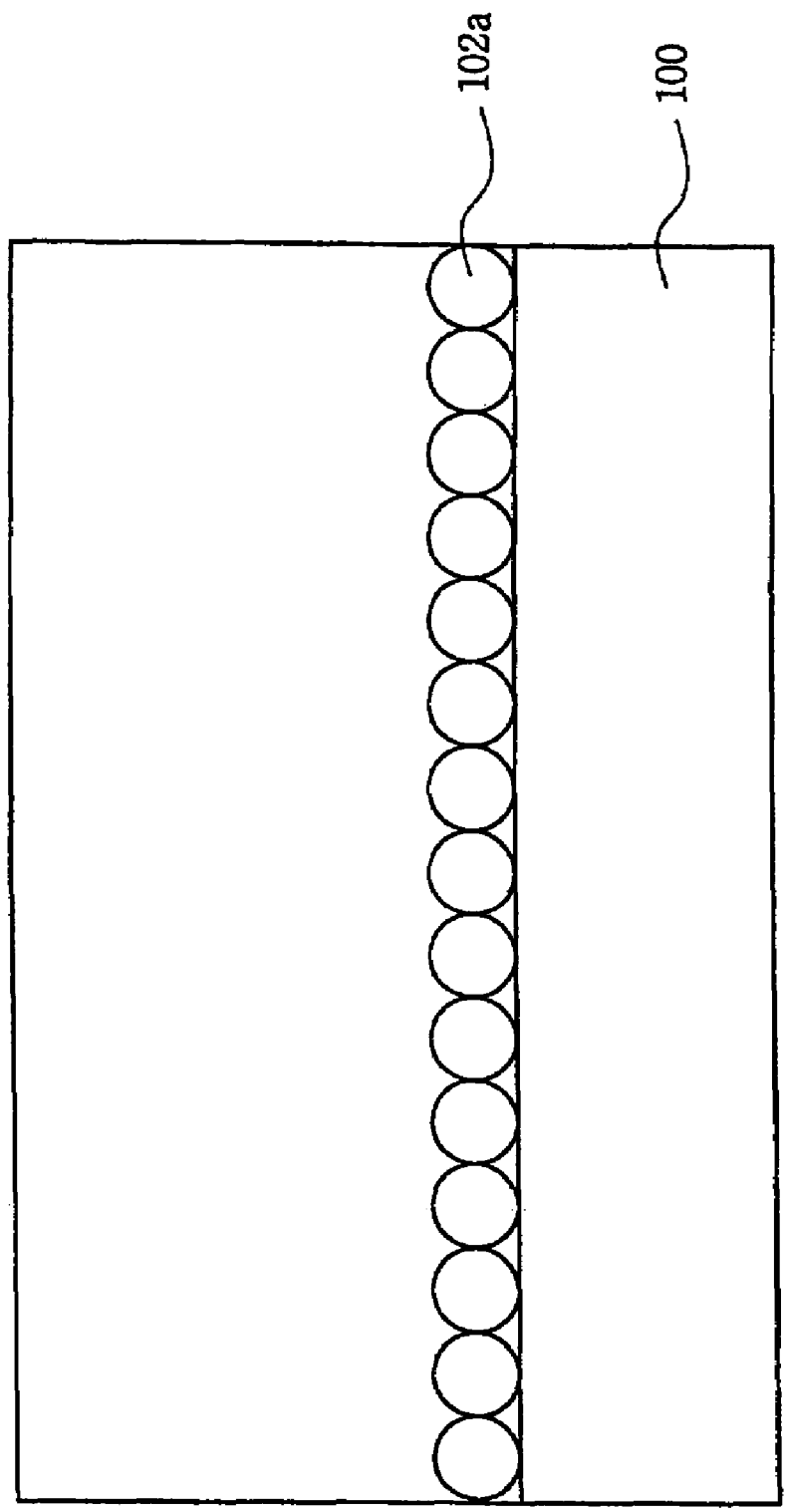

Referring to FIG. 2C, a fuzzy process may be performed by supplying an inert gas inside the chamber where the element A 102a forms strong chemisorption bonds with the semiconductor substrate 100. During the fuzzy process, the reactant $X_n$ 102b which forms weak physisorption bonds with the element A 102a may be separated. As a result, as illustrated in FIG. 2D, only the element A 102a which forms strong chemisorption bonds with the semiconductor substrate 100 may remain adsorbed to the semiconductor substrate 100.

A compound layer of the element A and the element B may be also formed by a method similar to that of depositing a thin film of a single element as described with reference to FIGS. 2A to 2D. For example, as illustrated in FIG. 2D, a reactant $BY_m$ formed with a chemical bonding of the element B and an element $Y_m$ may be supplied to the chamber where the element A 102a is adsorbed to the semiconductor substrate 100. Due to the addition of reactant $BY_m$ in the chamber, the reactant $BY_m$ and the element A absorbed on the semiconductor substrate 100 may react with each other to form an A-B bonding. Furthermore, the reactants mY and nX may bond with each other and then be removed as gaseous by-products by the fuzzy process. In addition, the reactant $BY_m$ that is physically adsorbed to the chamber may also be removed by the fuzzy process. Thus the film including elements A and B may grow by as much as one monolayer.

As mentioned above, in an exemplary embodiment of the invention, an epitaxial film may be grown in the upper part of the semiconductor substrate using ALD technology. The semiconductor device manufacturing method using ALD technology according to an exemplary embodiment of the present invention will now be described in detail with reference to FIGS. 3A to 3E.

Figure 3A:
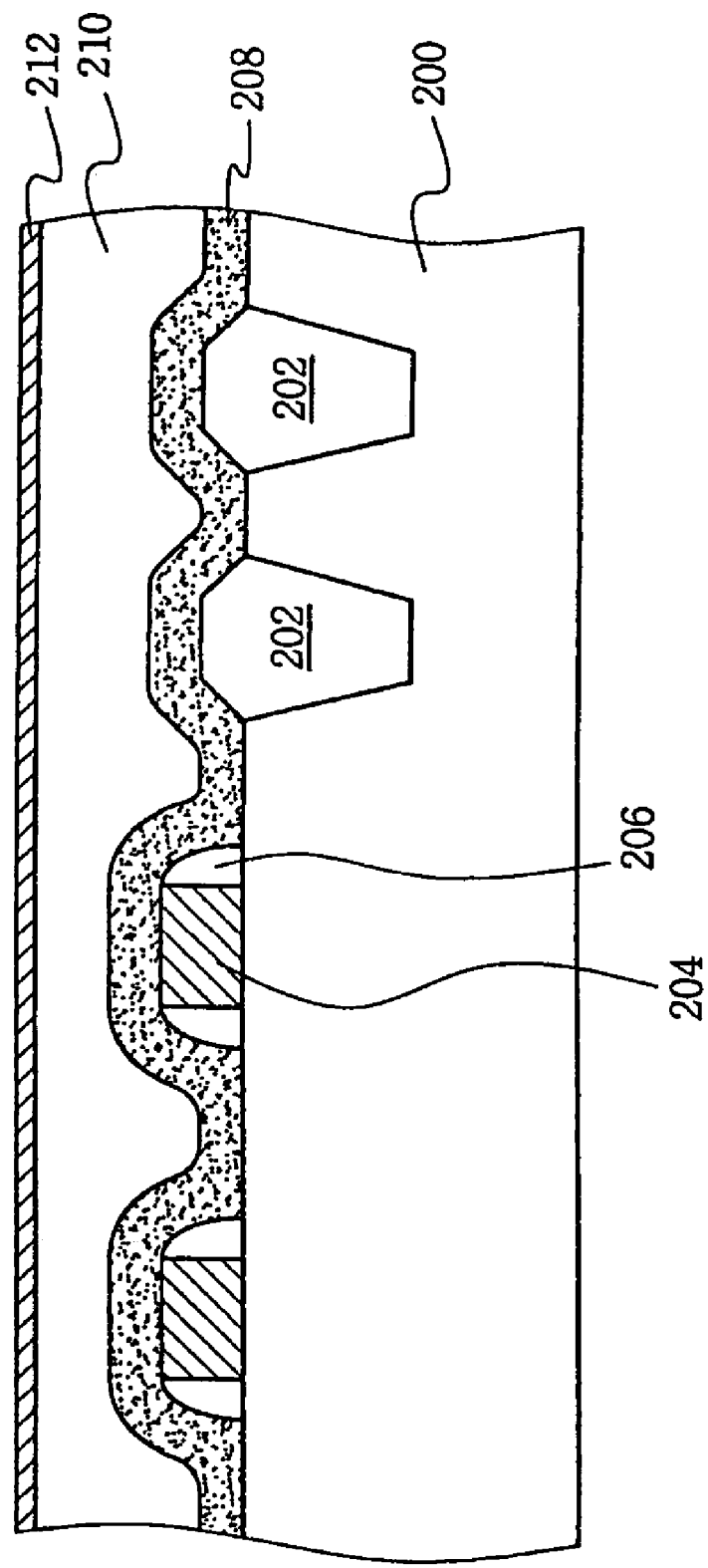

Referring to FIG. 3A, a gate region 204 provided with a sidewall spacer 206 may be formed on a P-type semiconductor substrate 200. P-type semiconductor substrate 200 may include an active region and a field region that are defined by a trench element separation film 202. Furthermore, though it may not be illustrated, an impurity diffusion region which functions as a source/drain region may be formed by performing ion-implantation of a pentavalent impurity below the gate region 204. In an exemplary embodiment, if the semiconductor substrate 200 is N-type, the ion-implantation of a trivalent impurity is performed in the source/drain region.

Furthermore, an inter-layer insulation film may be formed by sequentially depositing a silicon nitride film 208 and an oxide film 210 such as HTO, at a thickness of 200 Å and 600 Å on the semiconductor substrate 200 having the gate region 204.

In addition, the ALD process may be performed on the oxide layer 210 so as to form an amorphous silicon ALD film 212. For example, the silicon ALD film 212 may be formed at a thickness of less than 10 Å by performing the ALD process for less than 5 cycles.

Figure 3B:
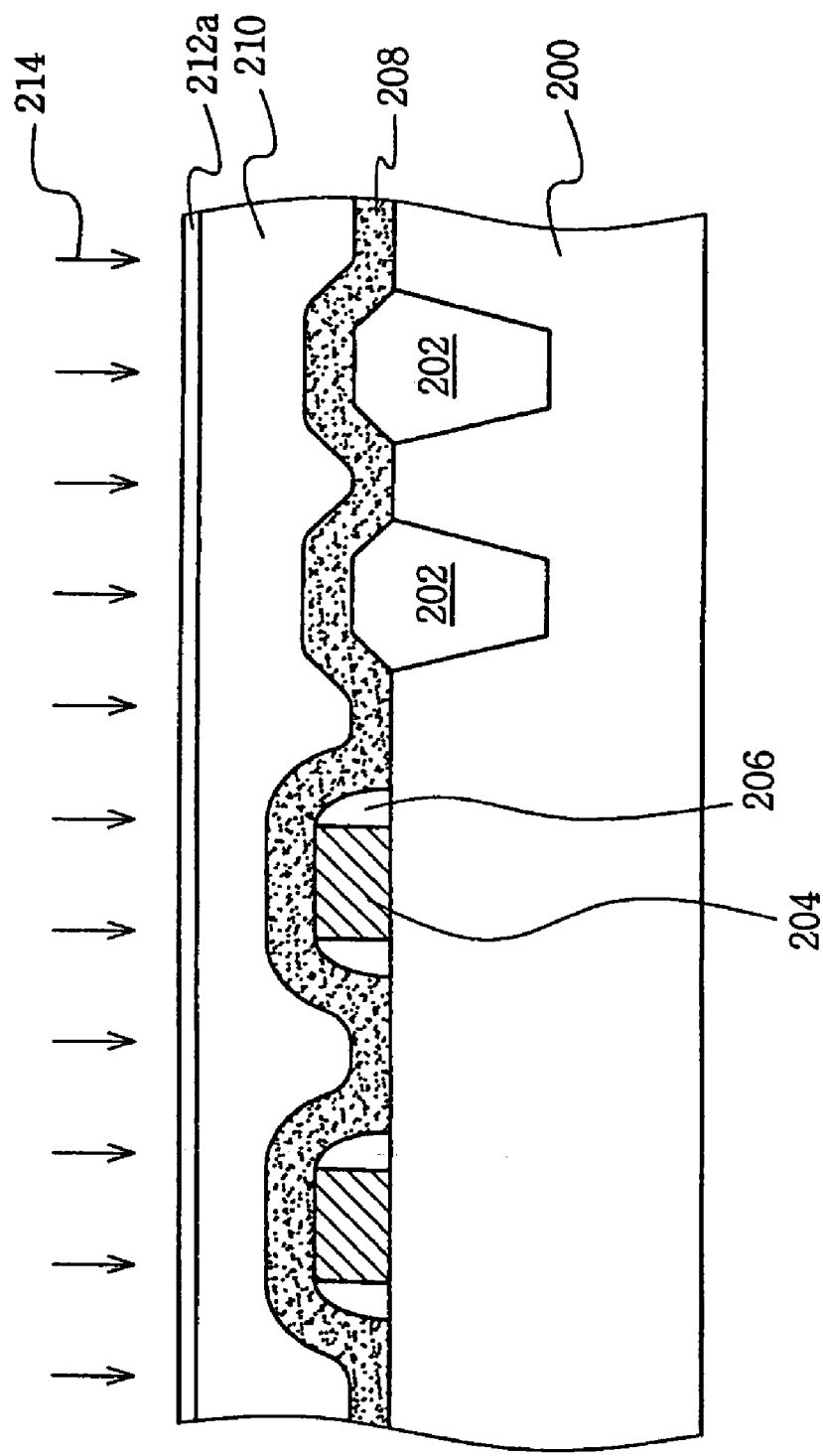

Referring to FIG. 3B, a first annealing process 214 may be performed on the amorphous silicon ALD film 212 formed through the ALD process at a temperature of 600° C. under atmospheric pressure. As a result, the amorphous silicon ALD film 212 may be annealed and changed into a single-crystallized silicon ALD film 212a.

Referring to FIG. 3C, an amorphous silicon film 216 may be deposited on the single-crystallized silicon ALD film 212a at a thickness of about 250 Å.

Figure 3D:
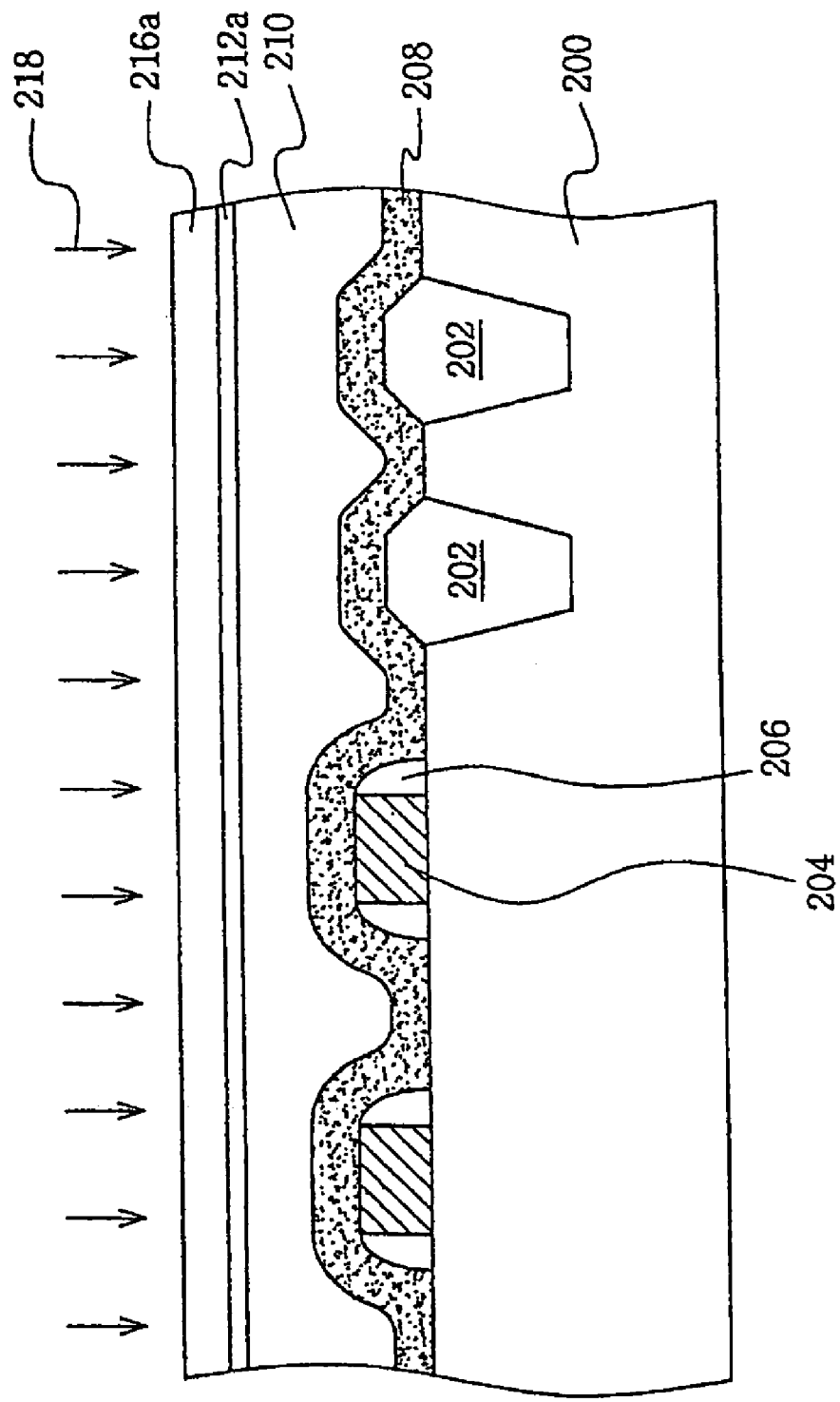

Referring to FIG. 3D, a second annealing process 218 may be performed to the resultant products including the amorphous silicon film 216. In an exemplary embodiment, the second annealing process 218 may be performed for twelve hours at a temperature of 600° C. under atmospheric pressure.

Due to the second annealing process and because the single-crystallized silicon ALD film 212a functions as a seed, irregular silicon particles of the amorphous silicon film 216 may be changed into an epitaxial silicon film 216a having the same single crystal gating structure as the single-crystallized silicon ALD film 212a.

Furthermore, it may be possible to simultaneously perform the first annealing process 214 for single-crystallizing the amorphous silicon ALD film 212 and the second annealing process 218 for single-crystallizing the amorphous silicon film 216. However, when the first and the second annealing process 214 and 218 are performed simultaneously, the characteristic of the epitaxial silicon film 216a may deteriorate. Therefore, it may be desirable to perform the annealing processes 214 and 218 in sequence.

Figure 3E:
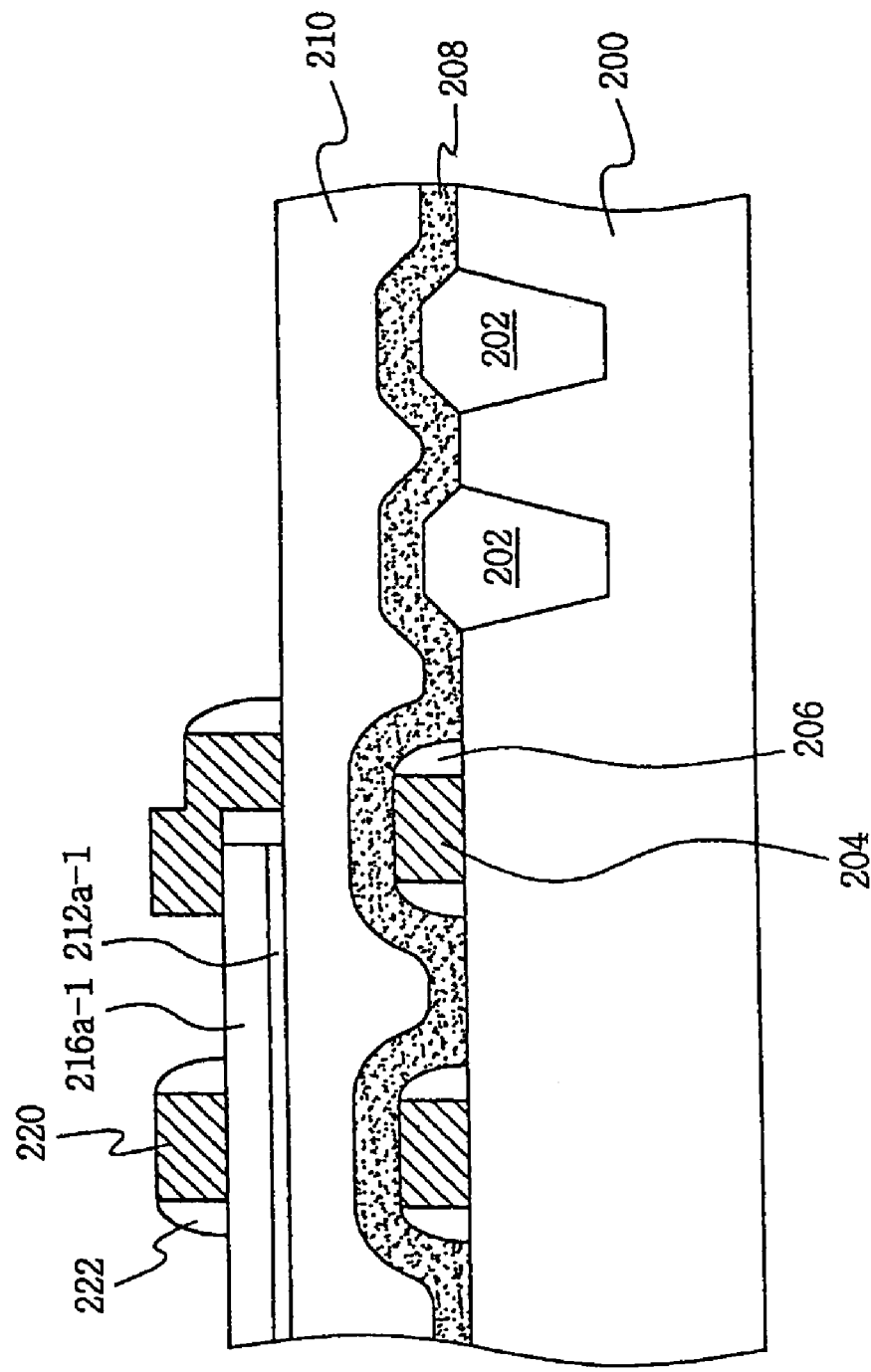

Referring to FIG. 3E, the single-crystallized epitaxial silicon film 216a and the single-crystallized silicon ALD film 212a may be patterned in channel silicon patterns 212a-1 and 216a-1 by performing the photolithography process. Specifically, in a semiconductor device having a single stack layer structure, the channel silicon patterns 212a-1 and 216a-1 may define a region in which an upper transistor may be formed in the same vertical line as that of a lower transistor including the gate region 204.

The upper transistor may be formed in the single stack layer structure by forming a gate region 220 with a sidewall spacer 222 on the resultant products including the channel silicon patterns 212a-1 and 216a-1, and by forming an impurity diffusion region (not shown) which functions as a source/drain region. Furthermore, though it is not illustrated, an inter-layer insulation film and a metal wiring may be formed on the resultant products including the upper transistor. In addition, a node contact may be formed so as to electrically connect the metal wiring to the gate region 220. Accordingly, a semiconductor device in the single stack layer structure may be formed according to an exemplary embodiment of the present invention.

While in one exemplary embodiment, the photolithography process for forming the channel silicon pattern may be performed after the amorphous silicon film 216 is changed into the single-crystallized epitaxial silicon film 216a through the annealing process, in another exemplary embodiment, the annealing process for single-crystallizing the amorphous silicon film 216 may be performed after performing the photolithography process for forming the channel silicon pattern.

Conventionally, in forming a channel silicon pattern in a single stack layer structure where two or more layers of MOS transistors are formed in layers, a selective epitaxial film on which the deposition and the etching process are simultaneously performed, was used as the seed. However, because the deposition and the etching process are performed together in the selective epitaxial process, the growth rate of the epitaxial film may be low, thereby causing difficulty in mass producing the semiconductor devices.

Therefore, the selective epitaxial process may be skipped in an exemplary embodiment of the invention. Furthermore, the single-crystallized ALD 212a may be formed by performing the ALD process. This may be profitable for a high-integration element because the thickness of deposition may be freely controlled while skipping the SEG process. Furthermore, a channel silicon pattern may be formed by changing the amorphous silicon film into the epitaxial silicon film by using the single-crystallized silicon ALD film 212a as the seed.

The disclosed method may be used to manufacture any semiconductor device. By using ALD technology instead of the SEG process that has a low growth rate of epitaxial film, the disclosed method may reduce increase the speed at which a semiconductor device is manufactured. Furthermore, the disclosed method may reduce the failure rate in the manufacturing process by obtaining a process margin for forming the following node contact. The reduction in failure rate and increase in manufacturing speed may improve the yield and the reliability of the semiconductor manufacturing process.

It will be understood by those of ordinary skill in the art that various replacements, modifications and changes in form and details may be made therein without departing from the spirit and scope of the present invention as defined by the following claims. Therefore, it is to be appreciated that the above described embodiments is for purposes of illustration only and not to be construed as a limitation of the invention.

What is claimed is:

1. A method of manufacturing a semiconductor device, comprising:
   - forming a silicon atomic layer film on a semiconductor substrate;
   - performing a first annealing process which crystallizes the silicon atomic layer film;
   - forming an amorphous silicon film on the crystallized silicon atomic layer film; and
   - performing a second annealing process on the semiconductor substrate having the amorphous-silicon film to change the amorphous silicon film into a single-crystal epitaxial silicon film by using the crystallized silicon atomic layer film as a seed layer.

2. The method according to claim 1, wherein the silicon atomic layer film is formed by repeating the atomic layer deposition for less than 5 cycles.

3. The method according to claim 2, wherein the first annealing process is performed at a temperature of 600° C. and under atmospheric pressure.

4. The method according to claim 1, wherein the amorphous silicon film is deposited at a thickness of 250 Å.

5. The method according to claim 4, wherein the second annealing process is performed for 12 hours at a temperature of 600° C. under atmospheric pressure.

6. The method according to claim 1, wherein the amorphous silicon film is formed on an interlayer insulation film positioned on a transistor.

7. The method according to claim 6, wherein the silicon atomic layer film is formed by repeating an atomic layer deposition for less than 5 cycles.

8. The method according to claim 7, wherein the first annealing process is performed at a temperature of 600° C. under atmospheric pressure.

9. The method according to claim 6, wherein the amorphous silicon film is formed at a thickness of 250 Å.

10. The method according to claim 9, wherein the second annealing process is performed for 12 hours at a temperature of 600° C. under atmospheric pressure.

* * * * *